(12) United States Patent
Onishi (10) Patent No.: US 8,665,017 B2
(45) Date of Patent: Mar. 4, 2014

(54) AMPLIFIER CIRCUIT AND RADIO COMMUNICATION APPARATUS

(75) Inventor: Masahiko Onishi, Osaka (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 27 days.

(21) Appl. No.: 13/580,888

(22) PCT Filed: Dec. 13, 2010

(86) PCT No.: PCT/JP2010/072379
§ 371 (c)(1),
(2), (4) Date: Aug. 23, 2012

(87) PCT Pub. No.: WO2011/125261
PCT Pub. Date: Oct. 13, 2011

(65) Prior Publication Data
US 2012/0326777 A1 Dec. 27, 2012

(30) Foreign Application Priority Data
Apr. 9, 2010 (JP) .................................. 2010-090167

(51) Int. Cl.
*H03G 3/20* (2006.01)
(52) U.S. Cl.
USPC .......................................... 330/136; 330/280
(58) Field of Classification Search
USPC ............................. 330/2, 136, 280; 455/114.3
See application file for complete search history.

(56) References Cited

U.S. PATENT DOCUMENTS 7,602,243 B2 * 10/2009 Murao ........................... 330/136

FOREIGN PATENT DOCUMENTS

| JP | 2001-189685 A | 7/2001 |
| JP | 2009-141411 A | 6/2009 |
| JP | 2009-232296 A | 10/2009 |
| JP | 2009-290283 A | 12/2009 |

OTHER PUBLICATIONS

Donald F. Kimball, et al., "High-Efficiency Envelope-Traking W-CDMA Base-Station Amplifier Using GaN HFETs", IEEE Transactions on Microwave Theory and Techniques, vol. 54, No. 11, Nov. 2006.
Feipeng Wang, et al., "Design of Wide-Band Envelope-Tracking Power Amplifiers for OFDM Applications," IEEE Transactions on Microwave Theory and Techniques, vol. 53, No. 4, Apr. 2005.

* cited by examiner

*Primary Examiner* — Steven J Mottola
(74) *Attorney, Agent, or Firm* — Global IP Counselors, LLP (57) ABSTRACT

An amplifier circuit of envelope tracking scheme has a timing adjusting unit having a finite number of adjustment values for adjusting time by which the output is delayed from the input, and capable of adjusting a time difference between an input signal and a power supply voltage which reach an amplifier, by making a selection from the adjustment values; a test signal output unit capable of repeatedly sending out a test signal serving as the input signal at predetermined cycles; and an adjustment value determining unit sequentially measuring output power for m (≤k) periods from the amplifier while changing an adjustment value of the timing adjusting unit to a different value every k periods of the test signal, searching for an adjustment value at which a total sum of the output power form periods is maximum, and setting the adjustment value on the timing adjusting unit.

17 Claims, 8 Drawing Sheets

AMPLIFIER CIRCUIT AND RADIO COMMUNICATION APPARATUS

CROSS-REFERENCE TO RELATED APPLICATIONS

This U.S. National stage application of International Patent Application No. PCT/JP2010/072379, filed Dec. 13, 2010, which, in turn, claims priority under 35 U.S.C. §119(a) to Japanese Patent Application No. 2010-090167, filed in Japan on Apr. 9, 2010, the entire contents of which are hereby incorporated herein by reference.

TECHNICAL FIELD

The present invention mainly relates to an amplifier circuit used in a radio communication apparatus to amplify signal power.

BACKGROUND ART

For example, in a radio communication apparatus installed in a base station for mobile phones, a High Power Amplifier (HPA) is used. For such an amplifier, in order to increase the power efficiency thereof, there is proposed an envelope tracking scheme (also called a power modulation scheme or bias modulation scheme) that modulates a power supply voltage (drain voltage) using an envelope of an RF signal to be inputted (refer to, for example, Donald F. Kimball, et al., "High-Efficiency Envelope-Tracking W-CDMA Base-Station Amplifier Using GaN HFETs", IEEE Transactions on Microwave Theory and Techniques, Vol. 54, No. 11, November 2006, and Feipeng Wang, et al., "Design of Wide-Band Envelope-Tracking Power Amplifiers for OFDM Applications", IEEE Transactions on Microwave Theory and Techniques, Vol. 53, No. 4, April 2005. In this scheme, since the power supply voltage of the amplifier dynamically changes in accordance with the envelope of the RF signal, when the amplitude of the RF signal is small, the operating power of the amplifier is suppressed. As a result, the power efficiency improves.

In an amplifier of an envelope tracking scheme such as that described above, it is important that an RF signal and a power supply voltage modulated by an envelope of the RF signal reach the amplifier in synchronization with each other and have no timing shift therebetween. The timing shift is mainly caused by a difference in electrical length. Thus, circuit design is performed in consideration of electrical length so as to suppress the shift.

However, in practice, variations occur on a more minute level on a product-by-product basis and a timing shift occurs. Hence, an intended improvement in power efficiency cannot be obtained and distortion occurs in an input-output characteristic of the amplifier. Meanwhile, to eliminate such a timing shift, first, it is considered to measure how much shift there is currently. However, performing such a measurement itself is not easy.

SUMMARY

In view of such conventional problems, an object of the present invention is to provide an amplifier circuit that easily achieves synchronization between an input signal and a power supply voltage which are provided to an amplifier used by employing an envelope tracking scheme.

(1) An amplifier circuit of the present invention includes: an amplifier that amplifies power of an input signal; a power modulating unit that provides a power supply voltage to the amplifier, the power supply voltage being modulated based on the input signal; a timing adjusting unit that has a finite number of adjustment values for adjusting time by which output is delayed from input, and that is capable of adjusting a time difference between the input signal and the power supply voltage each reaching the amplifier by making a selection from the adjustment values; a test signal output unit capable of repeatedly sending out a predetermined test signal, as the input signal, at predetermined cycles; and an adjustment value determining unit that sequentially measures output power for m period(s) from the amplifier while changing an adjustment value of the timing adjusting unit to a different value at every k periods of the test signal when k is any natural number and m is any natural number satisfying m≤k, the adjustment value determining unit searching for an adjustment value at which a total sum or average of the output power for m period(s) is maximum to thereby set the adjustment value on the timing adjusting unit.

In the amplifier circuit configured in the above-described manner, instead of measuring a time difference, i.e., a timing shift, between an input signal and a power supply voltage which reach the amplifier, taking a look at the relationship between a timing shift and output power for m period(s) from the amplifier, an adjustment value at which the total sum or average of the output power is maximum is searched for, and the adjustment value is set on the timing adjusting unit. Accordingly, the timing shift is eliminated. In addition, by repeatedly sending out a predetermined test signal, a total sum or average of output power for m period(s) can be accurately compared with another.

(2) In the amplifier circuit according to the above-described (1), the test signal preferably has a frequency band same as an input signal for normal operation other than for testing.

In this case, the accuracy of timing adjustment based on the test signal and the easiness of adjustment can be appropriately ensured. If the frequency band of the test signal is wider than that of an input signal for normal operation, then accuracy improves but adjustment becomes difficult. In contrast, if the frequency band is narrower, then adjustment becomes easy but accuracy decreases.

(3) In the amplifier circuit according to the above-described (1) or (2), there is provided a distortion compensating unit having a function of adding an inverse distortion characteristic for canceling out an input-output distortion characteristic of the amplifier to an input signal; and the test signal output unit may send out the test signal in a state in which the function of the distortion compensating unit is temporarily halted at initial setting of the amplifier circuit.

In this case, (a) before allowing the distortion compensating unit to operate, first, a timing adjustment is made to appropriately set an initial value of the adjustment value and (b) at normal operation, distortion in an input-output characteristic of the amplifier can be removed by a process by the distortion compensating unit. When attempting to perform the process (b) without performing the process (a), it requires a long time to find an appropriate distortion compensation characteristic. However, by performing the process (a) first, an initial value for timing adjustment is appropriately set, and thus, in the process (b) appropriate distortion compensation can be performed promptly.

(4) In the amplifier circuit according to any one of the above-described (1) to (3), the adjustment value determining unit preferably includes a storage unit capable of storing the output power for m period(s).

In this case, output power exactly for m period(s) can be obtained no matter at which point of a k-period signal the obtainment starts. Thus, there is no need to obtain while monitoring (counting) m period(s).

(5) In the amplifier circuit according to any one of above-described (1) to (4), the test signal preferably includes, in one period, only signals that are not repeated in a same manner.

In this case, the same waveform is not repeated in one period. For one period of the test signal, signals over the length (duration) of one period should be recognized and there is no need to recognize the starting and end points of one period. Hence, it means that synchronization does not need to be achieved between the test signal output unit and the adjustment value determining unit. Therefore, a timing adjustment process is easy.

In addition, there is no chance of appearance of a plurality of candidates for an adjustment value at which the maximum power is obtained, and thus, it is easy to search for an adjustment value at which the maximum power is obtained.

Note that when, in addition to the inclusion of only signals that are not repeated in the same manner, a peak appears at one point in one period of the test signal, a change in output signal remarkably appears with respect to a timing shift, and thus, an adjustment can be made more accurately.

(6) Meanwhile, a radio communication apparatus of the present invention has the amplifier circuit described in the above-described (1) mounted thereon.

Such a radio communication apparatus can easily achieve synchronization between an input signal and a power supply voltage which are provided to the amplifier used by employing an envelope tracking scheme in the amplifier circuit. Thus, the power efficiency of the radio communication apparatus can be increased.

DETAILED DESCRIPTION OF EMBODIMENTS

<<Radio Communication Apparatus>>

An embodiment of the present invention will be described below with reference to the drawings.

Figure 8:
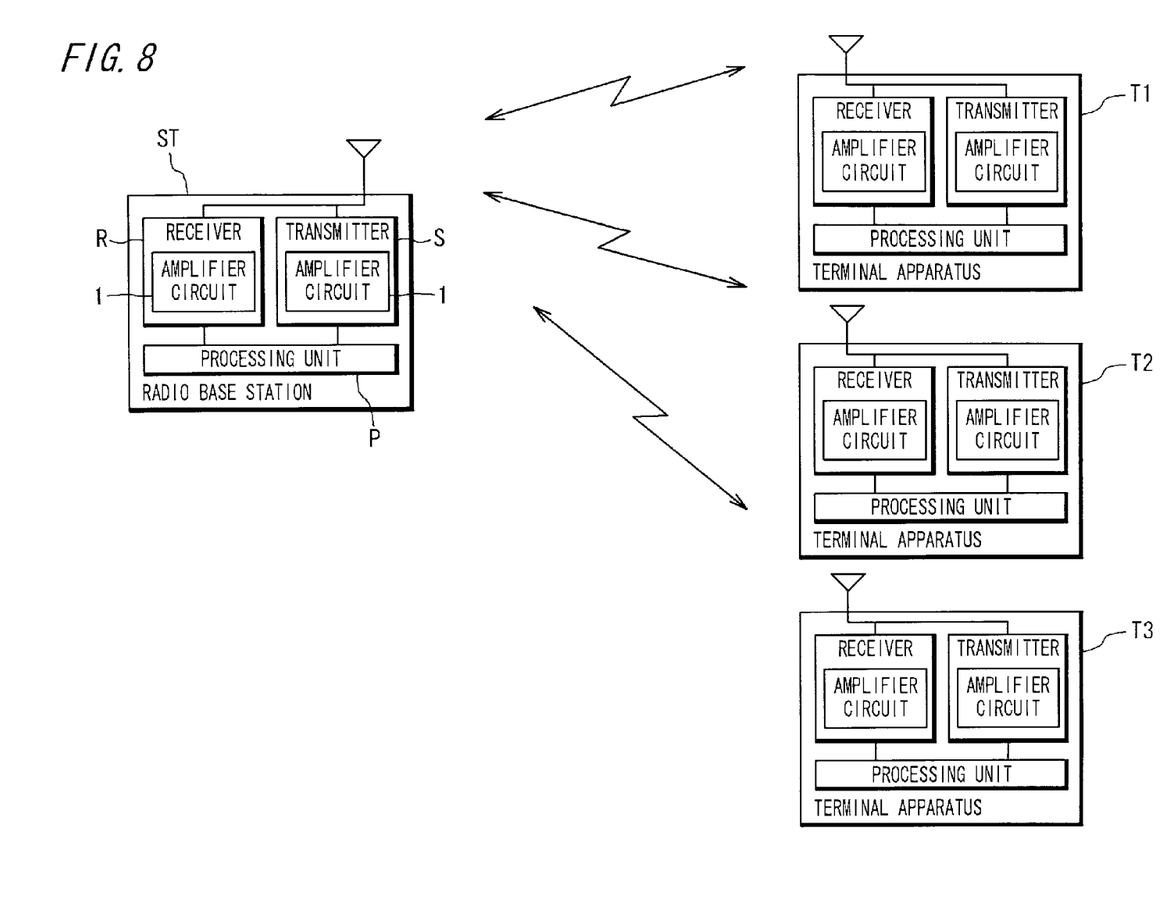
FIG. 8 is an example of a configuration diagram of a radio communication system having a radio communication apparatus of a radio base station; and radio communication apparatuses serving as terminal apparatuses.

FIG. 8 is an example of a configuration diagram of a radio communication system having a radio communication apparatus ST of a radio base station; and radio communication apparatuses T1, T2, and T3 serving as terminal apparatuses. The radio communication apparatus ST includes a transmitter S for transmitting radio signals; a receiver R for receiving radio signals; and a processing unit P that performs processes for transmit and receive signals. The radio communication apparatuses T1 to T3 also basically have the same internal configuration.

The transmitter S is to transmit linear modulation signals and has an amplifier circuit 1 that amplifies linear modulation signals. The receiver R is to receive linear modulation signals and has an amplifier circuit 1 for receiving and amplifying linear modulation signals. Since the basic configuration of the amplifier circuits 1 is the same for both the transmitter S and the receiver R, the amplifier circuit 1 of the transmitter S will be described below as a representative example.

<<Amplifier Circuit>>

Figure 1:
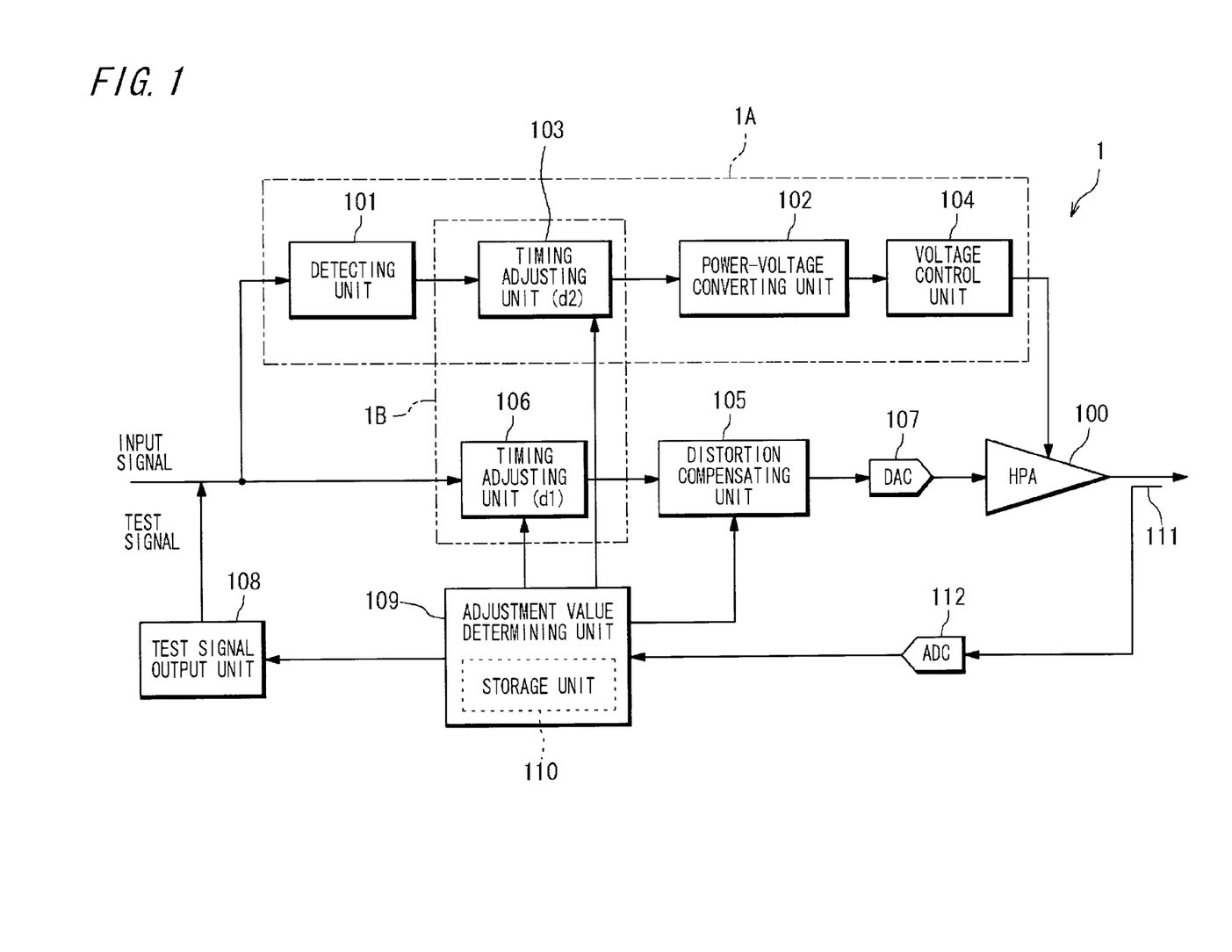
FIG. 1 is a block circuit diagram showing an amplifier circuit according to an embodiment of the present invention.

FIG. 1 is a block circuit diagram showing an amplifier circuit 1 according to an embodiment of the present invention. A power supply voltage (hereinafter, referred to as a drain voltage) which is modulated by a power modulating unit 1A based on an input signal (digital signal) is provided to an amplifier (HPA) 100. The power modulating unit 1A includes a detecting unit 101 that detects an input signal to extract an envelope signal; a timing adjusting unit 103 for adjusting the time by which the output is delayed from the input; a power-voltage converting unit 102 that performs power-voltage conversion on the envelope signal; and a voltage control unit 104 that finally performs D/A conversion and provides a drain voltage to the amplifier 100.

On the other hand, in a path up to where the input signal is provided to the amplifier 100 as a gate signal, there are provided a timing adjusting unit 106 for adjusting the time by which the output is delayed from the input; a distortion compensating unit (DPD: Digital Pre-Distorter) 105 for performing compensation for a distortion characteristic of the amplifier 100; and a D/A converter 107. The distortion compensating unit 105 monitors input and output signals to/from the amplifier 100 (depiction of an output monitoring circuit for distortion compensation is omitted) and grasps an input-output characteristic of the amplifier 100 from the input and output signals. Then, the distortion compensating unit 105 adds a characteristic inverse to the distorted input-output characteristic to the input signal and thereby cancels out distortion in the amplifier 100.

The above-described two timing adjusting units 103 and 106 each are, for example, a digital filter constituting an FIR filter, and can perform a process of delaying a signal by a predetermined time by appropriately making a phase adjustment without changing amplitude. There are prepared multiple values that can be selected as an adjustment value for timing adjustment, and an adjustment value d1 of the timing adjusting unit 106 on the gate side can be set to any of 0 to $\alpha$ ($\alpha$ is an integer) from among ($\alpha$+1) values. An adjustment value d2 of the timing adjusting unit 103 on the drain side can be set to any of 0 to $\beta$ ($\beta$ is an integer) from among ($\beta$+1) values. For example, the values of $\alpha$ and $\beta$ are represented by (a power of 2−1) such as 127 and 255.

In other words, the timing adjusting units 103 and 106 have a finite number of adjustment values for adjusting the time by which the output is delayed from the input, and are capable of adjusting a time difference between a gate signal serving as an input signal and a drain voltage which reach the amplifier 100, by selection of the adjustment values d1 and d2.

Note that a timing adjusting unit may be basically provided on only one of the gate and drain sides, but as an example of achieving more precise adjustment, in the present embodiment a timing adjusting unit 1B that achieves synchronization between a gate signal and a drain voltage which reach the amplifier 100 is configured by the two timing adjusting units 103 and 106 provided on both the gate and drain sides of the amplifier 100.

Power outputted from the amplifier 100 is detected by a directional coupler 111 and is provided to an adjustment value determining unit 109 through an A/D converter 112. The adjustment value determining unit 109 has a storage unit (memory) 110 therein and can sequentially store data on power outputted from the amplifier 100. The adjustment value determining unit 109 has the function of instructing the two timing adjusting units 103 and 106 about adjustment values d1 and d2 to be selected.

A test signal output unit 108 can send out a predetermined test signal to an electric circuit of the input signal. Note, however, that the test signal is sent out as a pseudo input signal at initial setting before normal operation (at an early stage of operation before performing communication). The test signal output unit 108 sends out a test signal by an instruction from the adjustment value determining unit 109. In addition, the adjustment value determining unit 109 can instruct the distortion compensating unit 105 as to whether or not to perform distortion compensation operation.

A test signal is repeatedly sent out at predetermined cycles. The test signal has the same frequency band as an input signal for normal operation other than for testing. Accordingly, the accuracy of timing adjustment based on the test signal and the easiness of adjustment can be appropriately ensured. If the frequency band of the test signal is wider than that of an input signal for normal operation, then accuracy improves but adjustment becomes difficult. In contrast, if the frequency band is narrower, then adjustment becomes easy but accuracy decreases.

In addition, the test signal includes, in one period, only signals that are not repeated in the same manner, and thus the same waveform is not repeated in one period. In this case, for one period of the test signal, signals over the length (duration) of one period should be recognized and there is no need to recognize the starting and end points of one period. Hence, synchronization does not need to be achieved between the test signal output unit 108 and the adjustment value determining unit 109. Therefore, a timing adjustment process is easy. Note that it is preferred that, in addition to the inclusion of only signals that are not repeated in the same manner, a peak appear at one point in one period of the test signal. In this case, a change in output signal remarkably appears with respect to a timing shift, and thus, an adjustment can be made more accurately.

The above-described test signal is a digital signal and is represented by $[x_0, x_1, \ldots, x_{n-1}]$. For example, (n−1) is 8191 ($=2^{13}-1$).

Of the components of the above-described amplifier circuit 1, those components other than the amplifier 100 and the voltage control unit 104, the D/A converter 107, the A/D converter 112, and the directional coupler 111 which handle an analog signal around the amplifier 100 are digital circuit elements and can be configured by, for example, software by a DSP. The digital circuit elements indicate the presence of functional elements and thus each element is not necessarily a separate and independent one.

In the amplifier circuit 1 configured in the above-described manner, if timing adjustment is already completed, then distortion (Pre-distortion) is added to an input signal by the distortion compensating unit 105. The input signal to which the distortion is added is subjected to a delay process with an adjustment value set on the timing adjusting unit 106. Thereafter, the input signal is converted into an analog signal and the analog signal reaches the amplifier 100 as a gate signal. On the other hand, an envelope signal obtained by the detecting unit 101 from the input signal is subjected to a delay process with an adjustment value set on the timing adjusting unit 103. Thereafter, the envelope signal is converted into a voltage signal by the power-voltage converting unit 102 and the voltage signal is converted into an analog drain voltage by the voltage control unit 104 and the drain voltage reaches the amplifier 100. By the timing adjustment, the timings at which the gate signal and the drain voltage reach synchronize with each other, making it possible to allow the amplifier 100 to operate by an envelope tracking scheme.

<<Theory That Serves as the Basis for Timing Adjustment>>

Next, timing adjustment will be described in detail. To tell the conclusion first, in the present embodiment, a timing adjustment is made based on the theory that the output from the amplifier 100 reaches its maximum when timings coincide, i.e., when a gate signal and a drain voltage which reach the amplifier 100 synchronize with each other. First, this theory will be described.

Figure 2:
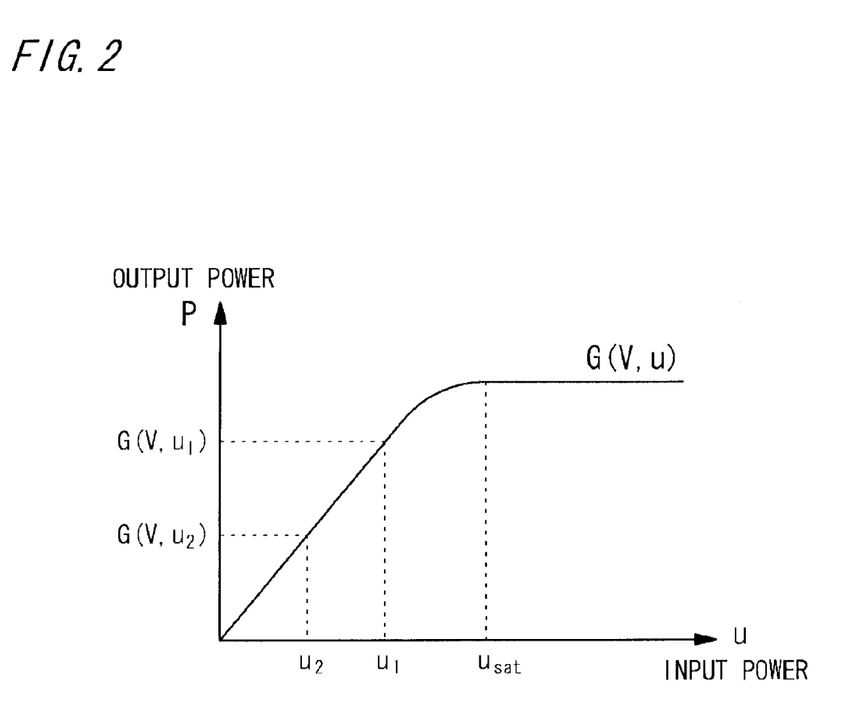
FIG. 2 is a graph showing condition 1 for a relationship between input power and output power.
Figure 3:
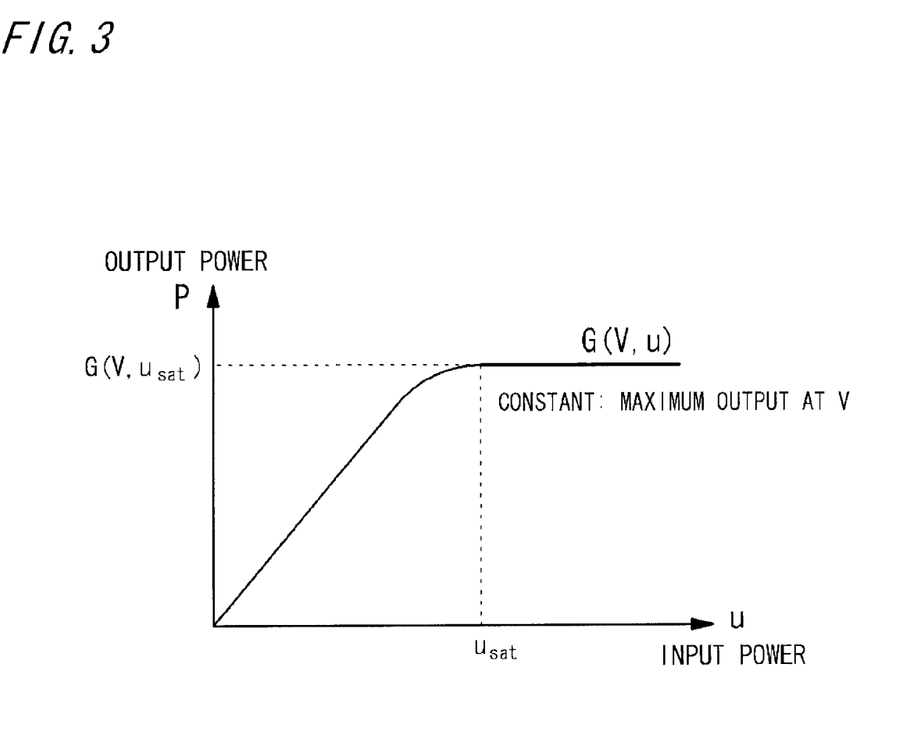
FIG. 3 is a graph showing condition 2 for the relationship between the input power and the output power.
Figure 4:
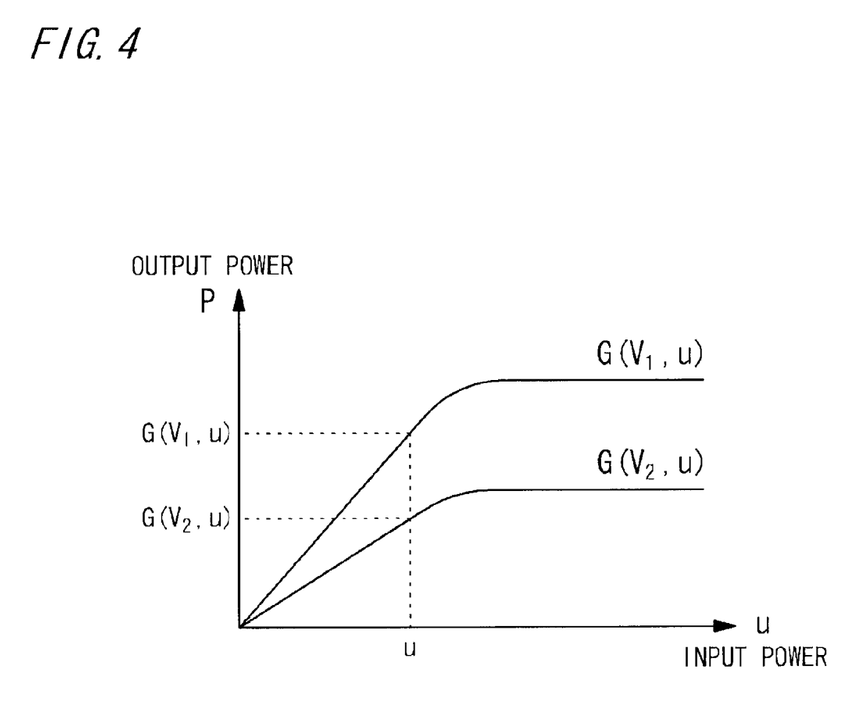
FIG. 4 is a graph showing condition 3 for the relationship between the input power and the output power.

When the input power to the amplifier 100 is u, the output power is P, the drain voltage is V, and the amplification characteristic is G, $P=G(V, u)$. As a specific characteristic having the amplification characteristic G, the following three conditions can be assumed. FIGS. 2 to 4 are graphs showing relationships between the input power u and the output power P.

Condition 1

Condition 1 is that, referring to FIG. 2, the output power satisfies the relationship $G(V, u_1) > G(V, u_2)$ for all "u" that satisfy the relationship $u_{sat} > u_1 > u_2$ ($u_{sat}$ is the saturation region and $u_1$ and $u_2$ are the non-saturation regions). In other words, condition 1 is that in the non-saturation regions the output power monotonously increases according to an increase in input power.

Condition 2

Next, condition 2 is that, referring to FIG. 3, the output power satisfies the relationship $G(V, u) = G(V, u_{sat})$ for all "u" that satisfy $u > u_{sat}$. In other words, condition 2 is that in the saturation region the output power is constant.

Condition 3

Furthermore, condition 3 is that, referring to FIG. 4, there exists at least one set of $V_1$ $V_2$ that satisfies the relationship $G(V_1, u) \geq G(V_2, u)$. In other words, condition 3 is that different characteristics of the output power can be obtained by setting different values for the drain voltage.

Condition 4

Condition 4 is that the amplifier circuit is one that operates by an envelope tracking scheme. In this case, using time t, when the input signal to the amplifier circuit 1 is x[t], the input signal to the amplifier 100 is represented by u(x[t]). The drain voltage is represented by V(x[t]). Here, for simplification, considering that when u[t]=x[t], V[t]=V(u[t]), the input power and the drain voltage to the amplifier 100 can be represented by u[t] and V(u[t]), respectively.

Figure 5:
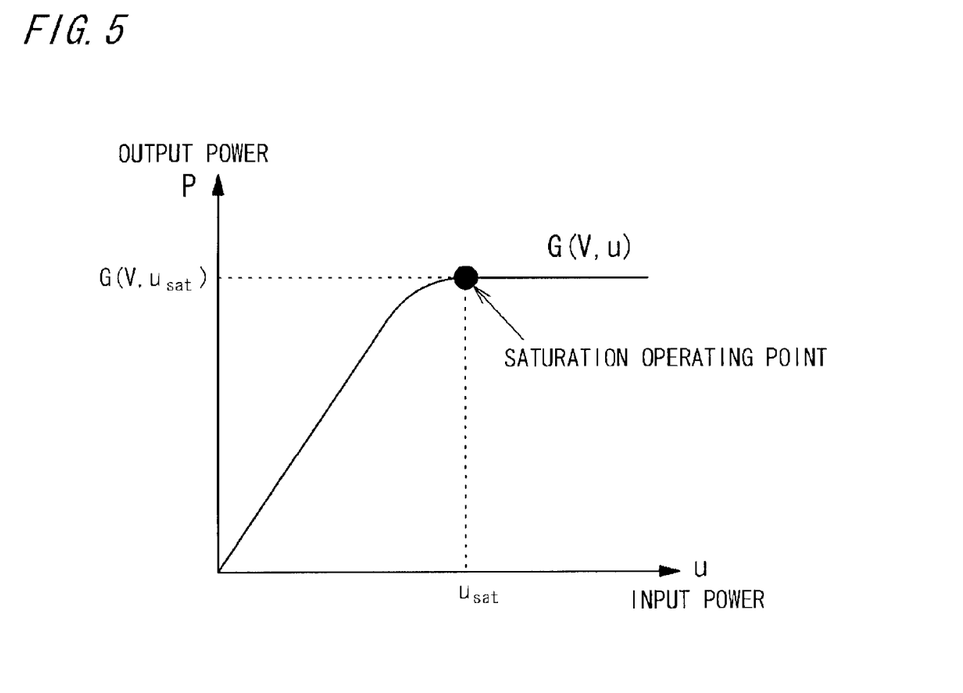
FIG. 5 is a graph showing condition 5 for the relationship between the input power and the output power.

Meanwhile, power-voltage conversion by the power-voltage converting unit 102 is performed according to conditions for a conversion function shown in the following conditions 5 and 6. FIG. 5 is a graph showing the relationship between the input power u and the output power P for condition 5.

Condition 5

The conversion characteristic of the conversion function V is that the conversion function is V serving as a function of u where a saturation operating point shown in FIG. 5 is present in the characteristic of the amplifier 100. In other words, it means that such a conversion function V that satisfies condition 2 for the amplifier 100 is used.

Condition 6

The conversion function is that it requires monotonicity and a conversion function V where $V(u_1) \geq V(u_2)$ for $u_1 > u_2$ is used.

Figure 6:
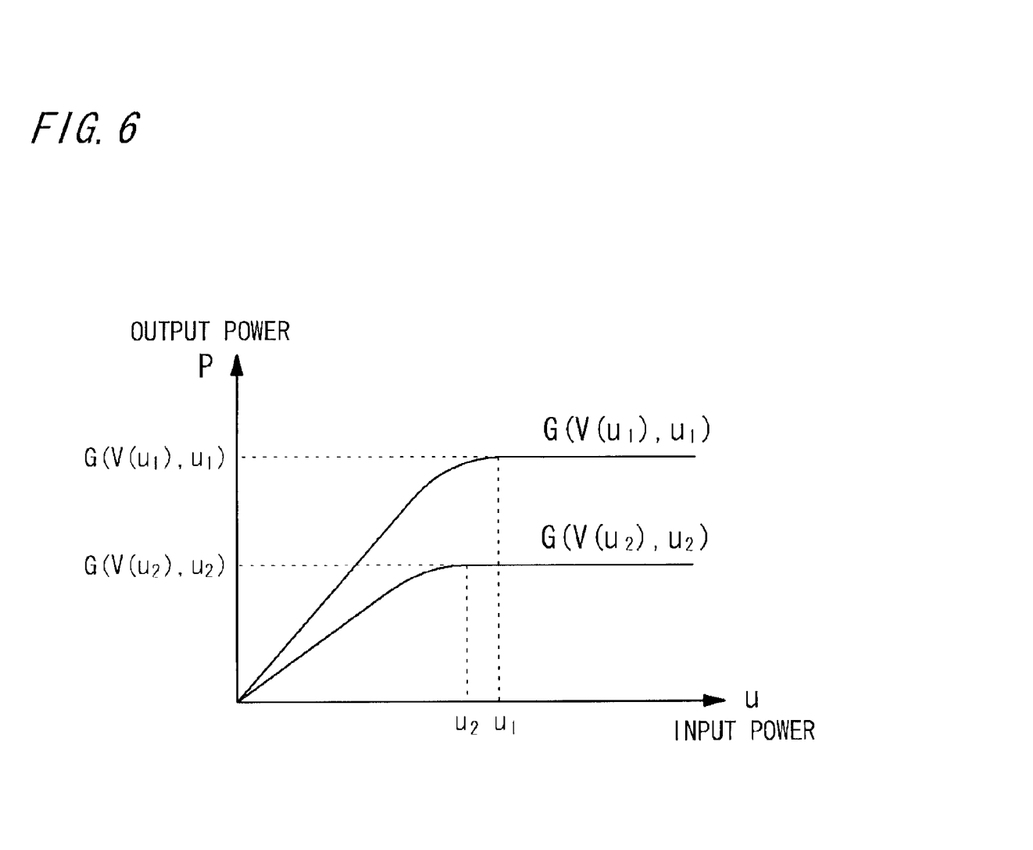
FIG. 6 is a graph showing a condition (1+3+6) for the relationship between the input power and the output power.

FIG. 6 is a graph showing the relationship between the input power u and the output power P for a complex condition. Referring to FIG. 6, when the above-described conditions 1, 3, and 6 are combined, a relationship where $G(V(u_1), u_1) > G(V(u_2), u_2)$ for all "u" that satisfy $u_1 > u_2$ is a condition for monotonicity.

Next, a test signal which is an input signal u(t) is a periodic signal with a period $n \cdot T_s$ that outputs $[x_0, x_1, \ldots, x_{n-1}]$ every sampling period $T_s$ of digital processing. Here, the total sum of output power $P_{sum}(\Delta t)$ during the time period from time 0 to $n \cdot T_s$ for when a timing shift between u[t] and V(u[t]) is $\Delta t$ ($0 \leq \Delta t < n \cdot T_s$) is considered.

The total sum of output power $P_{sum}(\Delta t)$ from the amplifier 100 corresponding to one period of the test signal is represented by the following equations (1) and (2).

Equation 1

$$P_{sum}(\Delta t) = \sum_{n=0}^{N-1} G(V(u[n \cdot T_s + \Delta t]), u[t]) \quad (1)$$

$$= P_{even}(\Delta t) + P_{Lower}(\Delta t) + P_{Higher}(\Delta t) \quad (2)$$

Where $$P_{even}(\Delta t) = \sum_{n \in N_1} G(V(u[n \cdot T_s + \Delta t]), u[t])$$

$$P_{Lower}(\Delta t) = \sum_{n \in N_2} G(V(u[n \cdot T_s + \Delta t]), u[t])$$

$$P_{Higher}(\Delta t) = \sum_{n \in N_3} G(V(u[n \cdot T_s + \Delta t]), u[t])$$

Note that the above-described $N_1$, $N_2$, and $N_3$ are the following sets:

$N_1$: the set of n satisfying $u[n \cdot T_s + \Delta t] = u[n \cdot T_s]$
$N_2$: the set of n satisfying $u[n \cdot T_s + \Delta t] < u[n \cdot T_s]$
$N_3$: the set of n satisfying $u[n \cdot T_s + \Delta t] > u[n \cdot T_s]$ The above-described $P_{even}(\Delta t)$ can be represented as follows. Note that to prove, using proof by contradiction, that the power outputted from the amplifier 100 is maximum at $\Delta t = 0$, in the following description power for the case in which $\Delta t$ is not 0 is computed.

$$P_{even}(\Delta t) = \sum_{n \in N_1} G(V(u[n \cdot T_s + \Delta t]), u[n \cdot T_s]) \quad \text{Equation 2}$$

$$= \sum_{n \in N_1} G(V(u[n \cdot T_s + \Delta t]), u[n \cdot T_s + \Delta t])$$

In addition, the above-described $P_{Lower}(\Delta t)$ can be represented as follows by condition 2.

$$P_{Lower}(\Delta t) = \sum_{n \in N_2} G(V(u[n \cdot T_s + \Delta t]), u[n \cdot T_s]) \quad \text{Equation 3}$$

$$= \sum_{n \in N_2} G(V(u[n \cdot T_s + \Delta t]), u[n \cdot T_s + \Delta t])$$

Furthermore, the above-described $P_{Higher}(\Delta t)$ can be represented as follows by condition 1.

$$P_{Highwe}(\Delta t) = \sum_{n \in N_3} G(V(u[n \cdot T_s + \Delta t]), u[n \cdot T_s]) < \quad \text{Equation 4}$$

$$\sum_{n \in N_3} G(V(u[n \cdot T_s + \Delta t]), u[n \cdot T_s + \Delta t])$$

$P_{sum}(\Delta t)$ is represented as follows using the above-described $P_{even}(\Delta t)$, $P_{Lower}(\Delta t)$, and $P_{Higher}(\Delta t)$.

$$P_{sum}(\Delta t) = P_{even}(\Delta t) + P_{Lower}(\Delta t) + P_{Higher}(\Delta t) < \quad \text{Equation 5}$$

$$\sum_{n \in N_1} G(V(u[nT_s + \Delta t]), u[nT_s + \Delta t]) +$$

$$\sum_{n \in N_2} G(V(u[nT_s + \Delta t]), u[nT_s + \Delta t]) +$$

$$\sum_{n \in N_3} G(V(u[nT_s + \Delta t]), u[nT_s + \Delta t]) =$$

$$\sum_{n \in \{N1, N2, N3\}} G(V(u[nT_s + \Delta t]), u[nT_s + \Delta t]) =$$

$$\sum_{n=0}^{N-1} G(V(u[nT_s]), u[nT_s]) = P_{sum}(0)$$

It can be seen by the above that if $\Delta t$ is not 0 then $P_{sum}(\Delta t)$ is always less than $P_{sum}(0)$, and $P_{sum}(0)$ is obtained when $\Delta t = 0$, i.e., the input signal u and the drain voltage V synchronize with each other and thus the timings thereof coincide with each other.

<<Example of Timing Adjustment>>

Figure 7:
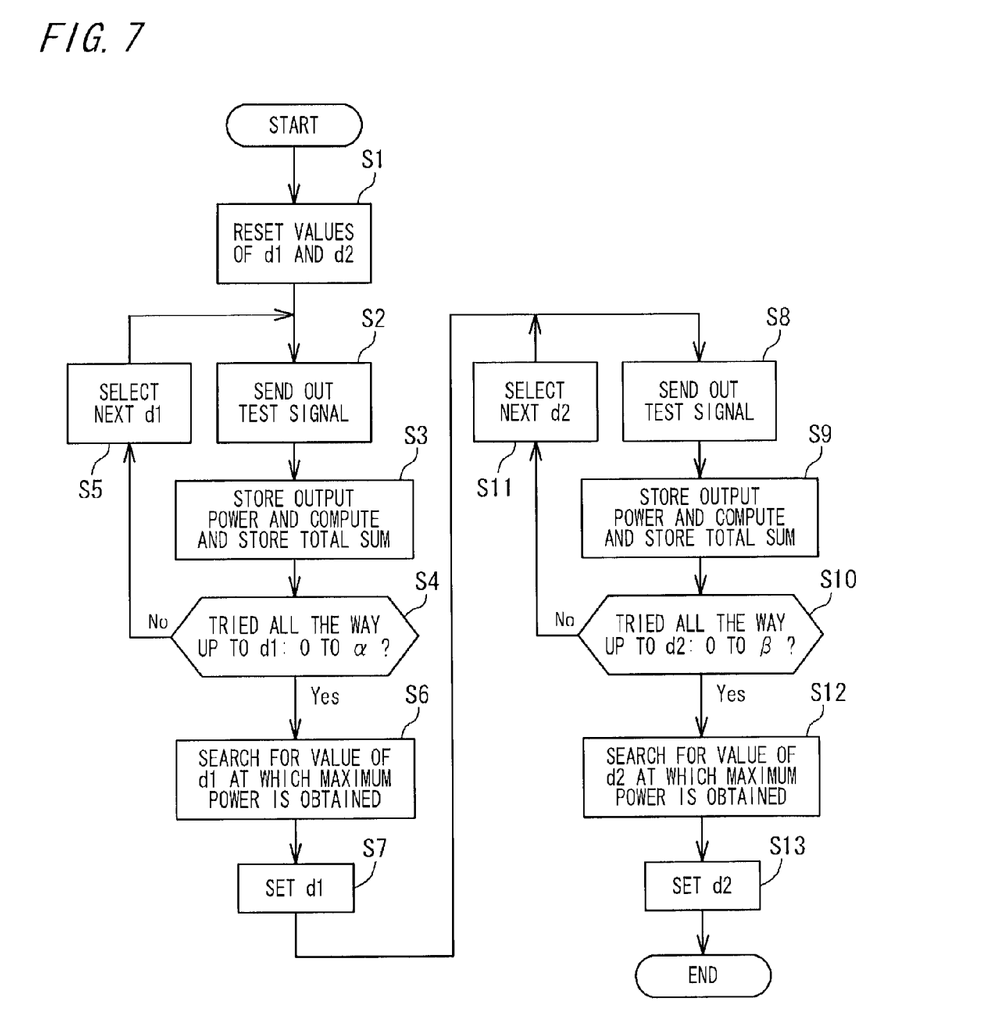
FIG. 7 is a flowchart showing an example of a timing adjustment process.

Next, an example of a timing adjustment made in the amplifier circuit 1 of FIG. 1 will be described. FIG. 7 is a flowchart showing an example of a timing adjustment process. The timing adjustment is made at the initial setting of the amplifier circuit 1, i.e., before normal operation. The subjects for the process are mainly the adjustment value determining unit 109 and the test signal output unit 108 of FIG. 1.

In FIG. 7, first, the adjustment value determining unit 109 resets adjustment values d1 and d2 for the timing adjusting units 106 and 103 (step S1). Accordingly, for example, the adjustment values d1 and d2 are both set to 0. In addition, at this time, in order that the distortion compensating unit 105 does not operate, the adjustment value determining unit 109 temporarily halts the function of the distortion compensating unit 105. The distortion compensating unit 105 in the temporarily halt state outputs an input as it is. Then, the adjustment value determining unit 109 allows the test signal output unit 108 to send out an amount of a test signal corresponding to one period as $[x_0, x_1, \ldots, x_{n-1}]$ for k period(s) (step S2). Here, k is any natural number.

The test signal is subjected to an adjustment with the adjustment value d1=0 by the timing adjusting unit 106, and is converted into an analog value and then the analog value is inputted to the amplifier 100 as a gate signal. On the other hand, an envelope signal of the test signal is subjected to an adjustment with the adjustment value d2=0 by the timing adjusting unit 103, and is converted into a voltage signal and then the voltage signal is provided from the voltage control unit 104 to the amplifier 100 as a drain voltage. Output power from the amplifier 100 is detected by the directional coupler 111 and is converted into a digital value by the A/D converter 112 and then the digital value is inputted to the adjustment value determining unit 109.

When the adjustment value determining unit 109 stores output power (raw waveform) for m period(s) in the storage unit 110, the adjustment value determining unit 109 computes the total sum of the output power ($P_{sum}$) and stores it in the adjustment value determining unit 109, separately from the output power for m period(s) (step S3). Here, m is any natural number satisfying m≤k. Note that the storage unit 110 capable of storing output power for m period(s) can obtain output power exactly for m period(s), no matter at which point of a k-period signal the obtainment starts. In other words, there is an advantage that there is no need to obtain while monitoring (counting) m period(s).

Then, the adjustment value determining unit 109 determines whether 0 to α have been tried for the adjustment value d1 (step S4). Here, the determination is "No" and thus the adjustment value determining unit 109 selects a next adjustment value d1=1 (step S5). Then, again, the adjustment value determining unit 109 allows the test signal output unit 108 to send out a test signal for k period(s) (step S2), and stores (overwrites) output power for m period(s). Then, likewise, the adjustment value determining unit 109 computes and stores the total sum of the output power ($P_{sum}$) (step S3).

Note that, in terms of time, step S3 is performed after a lapse of sufficient time after the test signal is sent out by performing step S2 (the time required for the signal to reach the storage unit 110 through the D/A converter 107, the amplifier 100, and the A/D converter 112), and thereafter, steps S4→S5 or steps S4→S6 are performed.

When such a process is repeated all the way up to the adjustment value d1=α, the adjustment value determining unit 109 searches for an adjustment value d1 at which the total sum $P_{sum}$ is the maximum power, from among a units of data on the total sum $P_{sum}$ (step S6) and sets d1 to the value (step S7).

Note that in each computation of output power for m period(s), an average may be obtained instead of a total sum.

Note that, as described above, a test signal includes, in one period, only signals that are not repeated in the same manner, and thus the same waveform is not repeated, either. Therefore, there is no chance of appearance of a plurality of candidates for an adjustment value d1 at which the maximum power is obtained, and thus, it is easy to search for an adjustment value d1 at which the maximum power is obtained (the same can also be said for an adjustment value d2 which will be described later). Specifically, if the same waveform is repeated in one period at a time difference Δτ, then the same output power is obtained, for example, when the adjustment value is 0 and when the adjustment value is Δτ. Thus, there is a chance of appearance of a plurality of candidates for an adjustment value at which the maximum power is obtained. In addition, it is preferred that, in addition to the inclusion of only signals that are not repeated in the same manner, a peak appear at one point in one period of the test signal. In this case, a change in output signal remarkably appears with respect to a timing shift, and thus, an adjustment can be made more accurately.

Then, in order to search for d2 next with d1 fixed at the above-described value, the adjustment value determining unit 110 allows the test signal output unit 108 to send out an amount of a test signal corresponding to one period as [$x_0$, $x_1$, ..., $x_{n-1}$] for k period(s) (step S8). In addition, the adjustment value determining unit 109 stores output power (raw waveform) for m period(s) in the storage unit 110, and then, computes the total sum of the output power ($P_{sum}$) and stores it in the adjustment value sum, determining unit 109, separately from the output power for m period(s) (step S9).

Subsequently, the adjustment value determining unit 109 determines whether 0 to β have been tried for the adjustment value d2 (step S10). Here, the determination is "No" and thus the adjustment value determining unit 109 selects a next adjustment value d2=1 (step S11). Then, again, the adjustment value determining unit 109 allows the test signal output unit 108 to send out a test signal for k period(s) (step S8), and stores (overwrites) output power for m period(s). Then, likewise, the adjustment value determining unit 109 computes and stores the total sum of the output power ($P_{sum}$) (step S9).

Note that, in terms of time, step S9 is performed after a lapse of sufficient time after the test signal is sent out by performing step S8 (the time required for the signal to reach the storage unit 110 through the D/A converter 107, the amplifier 100, and the A/D converter 112), and thereafter, steps S10→S11 or steps S10→S12 are performed.

When such a process is repeated all the way up to the adjustment value d2=β, the adjustment value determining unit 109 searches for an adjustment value d2 at which the total sum $P_{sum}$ is the maximum power, from among β units of data on the total sum $P_{sum}$ (step S12) and sets d2 to the value (step S13).

Note that in each computation of output power for m period(s), an average may be obtained instead of a total sum.

In the process in the flowchart, the number of adjustment values obtained relatively by two adjustment values d1 and d2, i.e., the number of combinations, is α×β, and this is also the number of times a test signal in units of m periods is sent out.

By timing adjustment such as that described above, adjustment values d1 and d2 at which the total sum (or average) of output power from the amplifier 100 is maximum for m period(s) of a test signal are searched for, and are set on the timing adjusting units 106 and 103, respectively. As such, in the amplifier circuit 1 of the present embodiment, instead of measuring a time difference, i.e., a timing shift, between an input signal and a power supply voltage which reach the amplifier 100, taking a look at the relationship between a timing shift and output power for m period(s) from the amplifier 100, adjustment values at which the total sum (or average) of the output power is maximum are searched for, and the adjustment values are set on the timing adjusting unit 1B. Accordingly, the timing shift is eliminated.

Therefore, synchronization between an input signal and a power supply voltage which are provided to the amplifier 100 used by employing an envelope tracking scheme can be easily achieved. In addition, by repeatedly sending out a predetermined test signal, each total sum (or average) of output power for m period(s) can be accurately compared with another.

Furthermore, since the radio communication apparatuses (ST and T1 to T3/FIG. 8) using the above-described amplifier circuit 1 can easily achieve synchronization between an input signal and a power supply voltage which are provided to the amplifier 100 used by employing an envelope tracking scheme in the amplifier circuit 1, the power efficiency for the radio communication apparatuses can be increased.

When the above-described timing adjustment is completed, the amplifier circuit 1 can start normal operation. After starting normal operation, a DPD process by the distortion compensating unit 105 is performed together with envelope tracking. In this manner, the amplifier circuit 1 can: (a) first make a timing adjustment to appropriately set initial values of adjustment values before allowing the distortion compensating unit 105 to operate; and (b) remove, at normal operation, distortion in an input-output characteristic of the amplifier 100 by a DPD process by the distortion compensating unit 105. When attempting to perform the process (b) without performing the process (a), it requires a long time to find an appropriate distortion compensation characteristic. However, by performing the process (a) first, initial values for timing adjustment are appropriately set, and thus, in the process (b) distortion compensation can be performed promptly.

<<Others>>

Note that although the above-described timing adjustment is made at initial setting before normal operation, it is also possible to make a timing adjustment after starting normal operation by temporarily stopping normal operation whenever necessary.

Note also that although in the example of the above-described timing adjustment, description is made that adjustment values d1 and d2 are selected in ascending order from 0 to the maximum value, this is merely an example; they may be selected in descending order or furthermore they can be selected, starting from a specific value so as to sequentially increase or decrease in value.

Note that the locations where the timing adjusting units 103 and 106 are provided are not limited to those shown in FIG. 1. For example, the timing adjusting unit 103 may be provided between the power-voltage converting unit 102 and the voltage control unit 104, and the timing adjusting unit 106 may be provided between the distortion compensating unit 105 and the D/A converter 107.

Note that the embodiment disclosed herein is to be considered in all respects as illustrative and not restrictive. The scope of the present invention is indicated by the appended claims and is intended to include all changes which come within the meanings and range of equivalency of the claims.

INDUSTRIAL APPLICABILITY

According to an amplifier circuit of the present invention or a radio communication apparatus using the amplifier circuit, synchronization can be easily achieved between an input signal and a power supply voltage which are provided to an amplifier used by employing an envelope tracking scheme.

What is claimed is:

1. An amplifier circuit comprising:
an amplifier that amplifies power of an input signal;
a power modulating unit that provides a power supply voltage to the amplifier, the power supply voltage being modulated based on the input signal;
a timing adjusting unit that has a finite number of adjustment values for adjusting time by which output is delayed from input, and that is capable of adjusting a time difference between the input signal and the power supply voltage each reaching the amplifier by making a selection from the adjustment values;
a test signal output unit capable of repeatedly sending out a predetermined test signal, as the input signal, at predetermined cycles; and
an adjustment value determining unit that sequentially measures output power for m period(s) from the amplifier while changing an adjustment value of the timing adjusting unit to a different value at every k periods of the test signal when k is any natural number and m is any natural number satisfying m≤k, the adjustment value determining unit searching for an adjustment value at which a total sum or average of the output power for m period(s) is maximum to thereby set the adjustment value on the timing adjusting unit.

2. The amplifier circuit according to claim 1, wherein the test signal has a frequency band same as an input signal for normal operation other than for testing.

3. The amplifier circuit according to claim 1, wherein there is provided a distortion compensating unit having a function of adding an inverse distortion characteristic for canceling out an input-output distortion characteristic of the amplifier to an input signal, and
the test signal output unit sends out the test signal in a state in which the function of the distortion compensating unit is temporarily halted at initial setting of the amplifier circuit.

4. The amplifier circuit according to claim 2, further comprising
a distortion compensating unit having a function of adding an inverse distortion characteristic for canceling out an input-output distortion characteristic of the amplifier to an input signal, and
the test signal output unit sending out the test signal in a state in which the function of the distortion compensating unit is temporarily halted at initial setting of the amplifier circuit.

5. The amplifier circuit according to claim 1, wherein the adjustment value determining unit includes a storage unit capable of storing the output power for m period(s).

6. The amplifier circuit according to claim 2, wherein the adjustment value determining unit includes a storage unit capable of storing the output power for m period(s).

7. The amplifier circuit according to claim 3, wherein the adjustment value determining unit includes a storage unit capable of storing the output power for m period(s).

8. The amplifier circuit according to claim 4, wherein the adjustment value determining unit includes a storage unit capable of storing the output power for m period(s).

9. The amplifier circuit according to claim 1, wherein the test signal includes, in one period, only signals that are not repeated in a same manner.

10. The amplifier circuit according to claim 2, wherein the test signal includes, in one period, only signals that are not repeated in a same manner.

11. The amplifier circuit according to claim 3, wherein the test signal includes, in one period, only signals that are not repeated in a same manner.

12. The amplifier circuit according to claim 4, wherein the test signal includes, in one period, only signals that are not repeated in a same manner.

13. The amplifier circuit according to claim 5, wherein the test signal includes, in one period, only signals that are not repeated in a same manner.

14. The amplifier circuit according to claim 6, wherein the test signal includes, in one period, only signals that are not repeated in a same manner.

15. The amplifier circuit according to claim 7, wherein the test signal includes, in one period, only signals that are not repeated in a same manner.

16. The amplifier circuit according to claim 8, wherein the test signal includes, in one period, only signals that are not repeated in a same manner.

17. A radio communication apparatus having an amplifier circuit mounted thereto, wherein
the amplifier circuit includes:
an amplifier that amplifies power of an input signal;
a power modulating unit that provides a power supply voltage to the amplifier, the power supply voltage being modulated based on the input signal;
a timing adjusting unit that has a finite number of adjustment values for adjusting time by which output is delayed from input, and that is capable of adjusting a time difference between the input signal and the power supply voltage each reaching the amplifier by making a selection from the adjustment values;

a test signal output unit capable of repeatedly sending out a predetermined test signal, as the input signal, at predetermined cycles; and an adjustment value determining unit that sequentially measures output power for m period(s) from the amplifier while changing an adjustment value of the timing adjusting unit to a different value at every k periods of the test signal when k is any natural number and m is any natural number satisfying m≤k, the adjustment value determining unit searching for an adjustment value at which a total sum or average of the output power for m period(s) is maximum to thereby set the adjustment value on the timing adjusting unit.

* * * * *